United States Patent [19]
Benedikt et al.

[11] Patent Number: 5,044,349
[45] Date of Patent: Sep. 3, 1991

[54] HIGH-VOLTAGE SWITCH

[75] Inventors: Walter Benedikt, Kornwestheim; Werner Herden, Gerlingen, both of Fed. Rep. of Germany

[73] Assignee: Robert Bosch GmbH, Stuttgart, Fed. Rep. of Germany

[21] Appl. No.: 490,695
[22] PCT Filed: Sep. 13, 1988
[86] PCT No.: PCT/DE88/00566
  § 371 Date: Mar. 16, 1990
  § 102(e) Date: Mar. 16, 1990
[87] PCT Pub. No.: WO89/02528
  PCT Pub. Date: Mar. 23, 1989

[30] Foreign Application Priority Data
Sep. 18, 1987 [DE] Fed. Rep. of Germany ....... 3731393

[51] Int. Cl.$^5$ ............................................. F02P 3/12
[52] U.S. Cl. .................................................. 123/655
[58] Field of Search .............. 123/655, 656, 643, 633; 357/13, 76; 361/263

[56] References Cited
U.S. PATENT DOCUMENTS

| | | | |
|---|---|---|---|
| 4,138,710 | 2/1979 | Tsukuru | 123/655 |
| 4,411,247 | 10/1983 | Kunita et al. | 123/655 |
| 4,463,744 | 8/1984 | Tanaka et al. | 123/643 |
| 4,653,460 | 3/1987 | Ooyabu et al. | 123/645 |

Primary Examiner—Raymond A. Nelli
Attorney, Agent, or Firm—Michael J. Striker

[57] ABSTRACT

A high-voltage switch is suggested, particularly for ignition systems of internal combustion engines, which is characterized by a voltage-controlled electronic high-voltage switching unit which passes suddenly from the blocking state into the conducting state at a preselectable and predetermined voltage. The switching unit uses a state-changing or breakdown diode cascade (8) which switches through the voltage at the secondary winding (5) of an ignition coil (7) only after reaching the ignition voltage at the spark plug (1) of an internal combustion engine.

8 Claims, 1 Drawing Sheet

HIGH-VOLTAGE SWITCH

PRIOR ART

The invention is directed to a voltage controlled electronic high-voltage switch, particularly for ignition systems of internal combustion engines, which at a given voltage level is triggered into the conductive state.

It is known that spark plugs in internal combustion engines become carbon-fouled particularly during cold starting. Carbon fouling also occurs if spark plugs with an excessive heat value are used in an internal combustion engine. The layer of soot on a spark plug leads to a shunt which causes an energy discharge during the rise in the ignition voltage at the spark plug. Accordingly, the ignition voltage is often not achieved, so that misfiring occurs.

Booster or series connected spark gaps in the ignition systems which comprise electrodes fused into a glass bulb and provide for a spark at a predetermined voltage serve to solve this problem. But a disadvantage of these booster gaps consists in that the ignition voltage of the booster gap changes from one spark to another and during the life of the booster gaps. This is due to the erosion of the electrodes and to the fact that the gas surrounding the electrodes changes over time.

SUMMARY OF THE INVENTION

The high voltage switch according to the invention is assembled of a cascade of thyristors or silicon controlled rectifiers each having its gate connected to its cathode to act as a breakdown diode. The gate-cathode connection is provided within the chip of each thyristor.

In contrast to the prior art, the high-voltage switch according to the invention has the advantage that the ignition voltage can be preselected in a very accurate manner and in that the influence of shunts on the spark plug are practically eliminated. Due to the voltage-controlled, electronic high-voltage switching cascade, the ignition voltage is only applied to the spark plug after a selectable, high voltage of e.g. 20 kV. Accordingly, shunts cannot take effect during the rise in the ignition voltage. Also, spark plugs with excessive heat values fire readily even during cold starting.

The use of break-down or state-changing diode cascades as high-voltage switching elements is particularly advantageous. Ten to fifty of these diodes can be stacked one on top of the other, e.g. integrated in the connector of a spark plug, depending on the dielectric strength in individual state-changing diodes and depending on the desired ignition voltage. At a blocking voltage of 1 kV per diode and an ignition voltage of 20 kV, twenty of these components can consequently be connected in series.

An embodiment example of the invention is explained in more detail in the following description with the aid of the drawing

DESCRIPTION OF THE PREFERRED EMBODIMENTS

The high-voltage switch is generally usable in connection with high-voltage consumers. The use of the high-voltage switch according to the invention in an ignition system of a motor vehicle is described in the following by way of example.

Figure 1:
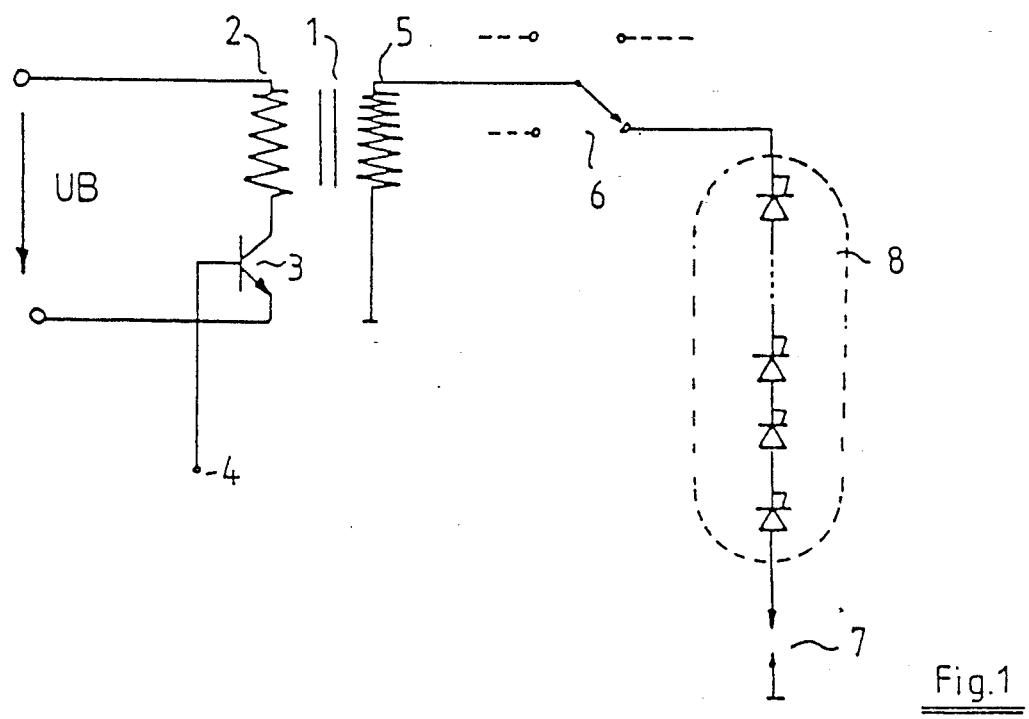
FIG. 1 shows a basic wiring diagram of an ignition system including the high-voltage switches according to the invention.

FIG. 1 shows an ignition coil 1 whose primary winding 2 is connected via a control transistor 3 to a voltage supply $U_B$, e.g. the battery of a motor vehicle, not shown. The control transistor 3 is driven in a known manner by a non-illustrated control device via a control terminal 4.

The secondary winding 5 of the ignition coil 1 is connected with a distributor 6 which drives the individual high-voltage consumers, in this instance the spark plugs 7 of a motor vehicle. A voltage-controlled, electronic high-voltage switching unit which is preferably constructed as a state-changing or break-down diode cascade 8 is arranged immediately prior to the individual spark plugs, only one of which is shown here for the sake of simplicity.

The state-changing diodes are two-pole silicon controlled rectifiers or thyristors, that is, thyristors in which the gate and cathode are connected with one another via a resistance of 0 to $\infty$ $\Omega$. In the embodiment example described here, there is an immediate connection of the aforementioned thyristor connections. The characteristic lines of these state-changing diodes correspond to those of thyristors: as voltage increases the component blocks until a specific breakdown voltage $U_K$ of e.g. 1 kV. When the breakdown voltage $U_K$ is exceeded, the component suddenly becomes conductive, wherein the forward voltage drop $U_D = 1$ to 2 V. A plurality of these state-changing diodes are connected in series, so that their breakdown voltage adds up and a desired breakdown voltage of the cascade can be adjusted. Twenty of these state-changing diodes are connected in series for a breakover voltage of e.g. 20 kV.

The state-changing diode cascades are produced in that semiconductor wafers are metallized on both sides, placed one on top of the other and baked together with the use of heat. If twenty state-changing diodes are connected in series, twenty of these wafers are baked together. Columns having a height e.g. of 10 mm and a cross section of $1 \times 1$ mm are then sawed out of this composite.

These columns can be installed in a desired location on the secondary side of an ignition coil, that is somewhere between the ignition coil and the spark plug. If they are installed in the area between the ignition coil and distributor rotor then only one state-changing diode cascade is required compared with installation in the area between the outer domes of the distributor and the spark plugs, where one state-changing diode cascade per cylinder is necessary. The closer the arrangement of the state-changing diode cascade to the spark plug, the greater the similarity between the level of the achieved voltage jump at the spark plug and the level of the breakdown voltage of the state-changing diode cascade. If the cascade is installed, for example, in the ignition coil, its breakdown voltage must be made substantially higher than the desired voltage jump at the spark plug.

Thus, favorable installation locations for the cascade are as follows:

1. In the distributor rotor or center dome of the distributor when using one state-changing diode cascade.

2. In the spark plug or preferably in the spark plug connector when using a plurality of state-changing diode cascades corresponding to the number of cylinders, since the spark plug connector has no expendable or wearing part compared with the spark plug.

The state-changing diode cascade is generally sealed with plastic or glass when installed.

Figure 2:
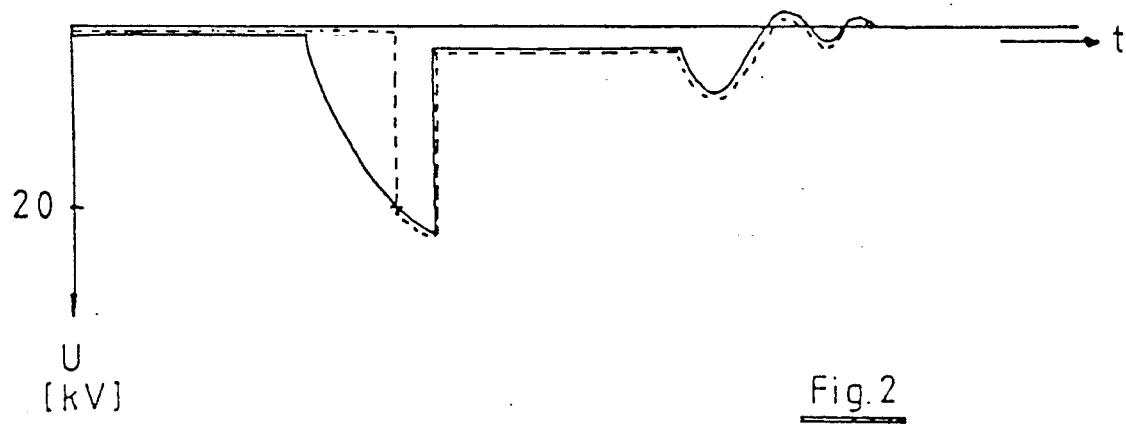
FIG. 2 shows the voltage curve at the spark plug and at the secondary winding of an ignition coil of the ignition system according to FIG. 1.

In FIG. 2, the voltage applied to the spark plug during the ignition process is shown in dashes and the voltage occurring on the secondary side of the ignition coil is represented by a solid line. The functioning of the high-voltage switch is explained in more detail in the following:

The functioning of the ignition coil 1 and the distributor 6 is known. This will not be discussed further. The distributor 6 indicated in FIG. 1 connects the spark plugs 7 with the ignition coil.

The voltage curve shown by a solid line in FIG. 2 results at the secondary winding 5 of the ignition coil when the current flowing through the primary winding 2 of the ignition coil 1 is turned off by means of the control transistor 3. In the present case an ignition voltage of approximately 20 kV is assumed. This value is reached after a rise time of approximately 40 us. During this time, shunts due to moisture or soot can cause a current to be drained off which is so great that the ignition voltage is no longer reached and misfiring occurs.

A so-called steepening effect is achieved with the aid of the state-changing diode cascades of the invention: the voltage at the cascade can increase up to the state-changing or breakdown voltage (e.g. 20 kV) predetermined by the quantity of state changing diodes which are stacked one on top of the other without voltage across individual diodes being applied to the spark plug. This is due to the blocking action of the state-changing diodes. As a result, shunts due to impurities cannot take effect before the ignition voltage corresponding to the sum of breakdown voltages of all diodes is achieved. As soon as the ignition voltage is reached, the state-changing diode cascade switches through suddenly, so that the ignition voltage is applied to the spark plug and a spark flashes over.

In principle, the state-changing diode cascade can be arranged at any desired location on the secondary side of the ignition coil. Due to the self-capacitance of the lines to the spark plugs, however, the steepening effect lessens as the line length increases. Therefore, the cascade is preferably provided directly in the spark plug connector.

Rise times of over 20 to several hundred ns, e.g. 50 ns, can be achieved for the voltage applied to the spark plug with the aid of this steepening effect. The spark plugs accordingly become insensitive with respect to shunts, which particularly improves the cold starting characteristics of the internal combustion engine.

Moreover, it has been shown that the heat value dimensioning of spark plugs is uncritical due to this state-changing diode cascade. It is known that "cold spark plugs", that is plugs with excessive heat values, tend to become carbon-fouled, which leads to shunts. This results in misfiring and cold starting problems. These problems are eliminated due to the improved voltage vs. time curve at the spark plug.

The voltage-controlled electronic high-voltage switch, according to the invention, also leads to a reduction in weight and cost. Previously the ignition coil always had to be designed so as to be large enough that sufficient energy was available for generating an ignition spark also under unfavorable conditions. In order to ensure this, large and heavy ignition coils were necessary, as well as high turn-off currents, which led to expensive systems. Because of the steepening effect of the switch of this invention, an ignition spark is reliably produced also with smaller, lower-energy ignition systems.

The wear on the electrodes at the spark plugs is also substantially reduced in that there is no longer a need for a high-energy ignition spark.

The turn-off current controlled by the switching transistor 3 is usually used in the ignition coil for generating the ignition spark. The described state-changing diode cascade serves to steepen the rise time for ignition voltage occurring across the spark plugs on the secondary side of the ignition coil. However, it can also be utilized for blocking off positive turn-on voltage pulses which can also reach values of over 2 kV. The latter occur in so-called "quiescent" high-voltage distributions, that is, in applications without rotating distributor spark gaps. For this purpose state-changing diodes having symmetrical characteristic lines must be employed which also remain in the blocking state during these positive voltages.

Finally, it must be noted that the described state-changing diode cascade is used not only in the original equipment of vehicles, but can also be easily installed subsequently.

We claim:

1. A high-voltage switch for use in an ignition system for internal combustion engines to ignite a spark plug, the high-voltage switch comprising a cascade of series-connected thyristors to be located upstream of the spark plug, each thyristor having a gate thereof connected with a cathode thereof to form a breakdown diode whereby a breakdown voltage of the cascade corresponds to a sum of breakdown voltages of individual breakdown diodes.

2. A high-voltage switch according to claim 1, wherein each of the thyristors is formed on a semiconductive chip; and the gate and the cathode of each thyristor are interconnected within the semiconductor chip.

3. A high-voltage switch according to claim 2, wherein electrodes of the individual breakdown diodes are connected to metalizations provided on opposite sides of corresponding semiconductor chips, the cascade being assembled of a stack of the metallized semiconductive chips with adjoining metallizations being baked together.

4. A high-voltage switch according to claim 3, wherein the stack of the metallized semiconductive chips is embedded in a sealing compound composed of a material selected from the group consisting of plastic, glass and ceramic cement.

5. An ignition system for an internal combustion engine, comprising an ignition coil having a secondary winding; a distributor located downstream of said secondary winding; at least one spark plug; a connector connecting the distributor with the at least one spark plug; and a high-voltage switch located in the connector between the distributor and the at least one spark plug, the high-voltage switch comprising a cascade of series-connected thyristors each having a gate thereof connected with a cathode thereof to form a breakdown diode whereby a breakdown voltage of the cascade corresponds to the sum of breakdown voltages of individual breakdown diodes.

6. An ignition system as set forth in claim 5, wherein said distributor includes a distributor dome and a distributor rotor arranged in the distributor dome, the high-voltage switch being installed in the distributor rotor.

7. An ignition system according to claim 6, wherein the distributor rotor has a connector socket arranged at a center of the distributor dome, the high-voltage switch being installed in the connector socket.

8. An ignition system according to claim 5, wherein the high-voltage switch is embedded in the spark plug.

* * * * *